(12) United States Patent
Tsujimura et al.

(10) Patent No.: US 6,611,005 B2
(45) Date of Patent: Aug. 26, 2003

(54) METHOD FOR PRODUCING SEMICONDUCTOR AND SEMICONDUCTOR LASER DEVICE

(75) Inventors: Ayumu Tsujimura, Osaka (JP); Yoshiaki Hasegawa, Osaka (JP); Akihiko Ishibashi, Osaka (JP); Isao Kidoguchi, Hyogo (JP); Yuzaburo Ban, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/796,702

(22) Filed: Mar. 2, 2001

(65) Prior Publication Data

US 2001/0008285 A1 Jul. 19, 2001

Related U.S. Application Data

(62) Division of application No. 09/179,935, filed on Oct. 28, 1998, now Pat. No. 6,265,287.

(30) Foreign Application Priority Data

Oct. 30, 1997 (JP) ............................................. 9-298380

(51) Int. Cl.$^7$ .......................... H01L 29/12; H01L 27/15
(52) U.S. Cl. ....................... 257/103; 257/79; 257/13; 257/11; 257/14; 257/613
(58) Field of Search .......................... 257/79, 103, 613, 257/615, 13, 11, 14

(56) References Cited

U.S. PATENT DOCUMENTS

| | | | | |
|---|---|---|---|---|
| 5,103,270 A | * | 4/1992 | Sato et al. ..................... | 357/17 |
| 5,777,350 A | * | 7/1998 | Nakamura et al. ............ | 257/96 |
| 5,793,061 A | * | 8/1998 | Ohuchi et al. ................. | 257/96 |
| 5,903,017 A | * | 5/1999 | Itaya et al. .................... | 257/190 |
| 6,091,083 A | * | 7/2000 | Hata et al. ..................... | 257/79 |
| 6,215,133 B1 | * | 4/2001 | Nakamura et al. ............ | 257/96 |
| 6,282,220 B1 | * | 8/2001 | Floyd ............................. | 372/50 |
| 6,320,209 B1 | * | 11/2001 | Hata et al. .................... | 257/190 |

FOREIGN PATENT DOCUMENTS

| | | |
|---|---|---|
| JP | 60175412 | 9/1985 |
| JP | 05074710 | 3/1993 |
| JP | 08325094 | 12/1996 |
| JP | 09169599 | 6/1997 |

OTHER PUBLICATIONS

Michio Sato, "Epitaxial Growth of InN by Plasma–Assisted Metalorganic Chemical Vapor Deposition", Jpn. J. Appl. Phys. vol. 36(1997), Part 2, No. 5B, pp. L595–L597, May 15, 1997.

Masatoshi Sano et al., "Epitaxial Growth of Undoped and Mg–Doped GaN", Japanese Journal of Applied Physics, vol. 15, No. 10, pp. 1943–1950, Oct., 1976.

\* cited by examiner

Primary Examiner—Eddie Lee
Assistant Examiner—Joseph Nguyen
(74) Attorney, Agent, or Firm—McDermott, Will & Emery

(57) ABSTRACT

The method for producing a semiconductor of the present invention grows a compound semiconductor on a substrate held by a susceptor provided, in a reaction chamber in accordance with a metalorganic vapor phase epitaxy technique. The method includes the steps of: supplying a Group III source gas containing indium and a Group V source gas containing nitrogen into the reaction chamber; and mixing the Group III and Group V source gases, supplied into the reaction chamber, with each other, and supplying a rare gas as a carrier gas into the reaction chamber so as to carry the mixed source gas onto the upper surface of the substrate.

2 Claims, 2 Drawing Sheets

METHOD FOR PRODUCING SEMICONDUCTOR AND SEMICONDUCTOR LASER DEVICE

This application is a Divisional of application Ser. No. 09/179,935 filed Oct. 28, 1998 now U.S. Pat. No. 6,265,287.

BACKGROUND OF THE INVENTION

The present invention relates to a method for producing a Group III–V compound semiconductor used for light-emitting devices, electronic devices and the like and also relates to a semiconductor laser device for emitting laser light at a short wavelength by using the same.

In recent years, semiconductor light-emitting devices (semiconductor laser devices, in particular) for emitting light in a short-wavelength region ranging from the spectrum of ultraviolet to the spectrum of blue have been vigorously researched and developed. This is because such devices ensure an increase in recording density of an optical disk or resolution of a laser printer and are applicable to various types of optical measuring instruments, medical devices, display devices and illuminators.

Examples of materials that can emit light at such a short-wavelength region include Group III–V compound semiconductors containing nitrogen. According to *Applied Physics Letters*, Vol. 70 (1997) pp. 1417–1419, a semiconductor laser device, including an Si-doped InGaN multi-quantum well active layer, can continuously oscillate at a wavelength of around 406 nm and at room temperature. As described in this document, the operating life thereof is 27 hours on the conditions that the temperature is 20° C. and the output power is 1.5 mW.

However, the operating life of the conventional semiconductor laser device using the InGaN-based compound semiconductors is still far from satisfactorily long, because in practice, an operating life exceeding 10,000 hours is often required.

SUMMARY OF THE INVENTION

In view of these problems, the present invention was made to procure an expected operating life for a semiconductor laser device emitting light at a short wavelength by using Group III–V compound semiconductors containing indium and nitrogen.

To accomplish this object, according to the present invention, in producing a Group III–V compound semiconductor containing indium and nitrogen by a metalorganic vapor phase epitaxy (MOVPE) technique, a rare gas is used as a carrier gas or nitrogen atoms or molecules contained in a nitrogen source are excited. On the other hand, in producing such a Group III–V compound semiconductor by a molecular beam epitaxy (MBE) technique, the nitrogen atoms, contained in the nitrogen source, are excited.

Specifically, a first method according to the present invention is a method for producing a semiconductor by growing a compound semiconductor on a substrate held by a susceptor provided in a reaction chamber in accordance with an MOVPE technique. The method includes the steps of: supplying a Group III source gas containing indium and a Group V source gas containing nitrogen into the reaction chamber; and mixing the Group III and Group V source gases, supplied into the reaction chamber, with each other, and supplying a rare gas as a carrier gas into the reaction chamber so as to carry the mixed source gas onto the upper surface of the substrate.

In accordance with the first method, a rare gas is used as a carrier gas for carrying a mixed source gas onto the upper surface of a substrate. Accordingly, as compared with using nitrogen gas as a carrier gas, the Group V source gas such as ammonium gas can be dissolved with higher efficiency. Also, since a rare gas has lower thermal conductivity than that of nitrogen gas, the generation of vacancies can be suppressed in nitrogen atoms in a crystal. As a result, the density of n-type residual carriers, which is ordinarily increased by the existence of nitrogen vacancies, can be reduced, and the resistance can be increased. Thus, even if an active layer is formed for a light-emitting device or the like by using a Group III–V compound semiconductor containing indium and nitrogen having respective carrier densities reduced, the active layer is not damaged easily. Consequently, an expected operating life can be secured.

In one embodiment of the present invention, the rare gas is preferably argon. In such an embodiment, the residual carrier density of the Group III–V compound semiconductor containing indium and nitrogen can be reduced with more certainty, because argon gas is available relatively easily compared with other rare gases.

A second method according to the present invention is a method for producing a semiconductor by growing a compound semiconductor on a substrate in accordance with an MOVPE technique. The method includes the steps of: supplying a Group III source gas containing indium onto the substrate; and supplying a Group V source gas containing nitrogen onto the substrate. The step of supplying the Group V source gas includes the step of making nitrogen atoms or molecules, contained in the Group V source gas, excited.

In accordance with the second method, in the step of supplying a Group V source gas containing nitrogen into a reaction chamber, nitrogen atoms or molecules, contained in the Group V source gas, are excited. Accordingly, the nitrogen atoms, having a high vapor pressure, are introduced more easily into the faces of crystals grown on the substrate. As a result, the generation of nitrogen vacancies can be suppressed in a crystal, and the density of n-type residual carriers, which is ordinarily increased by nitrogen vacancies, can be reduced. Thus, if an active layer is formed for a light-emitting device or the like by using a Group III–V compound semiconductor containing indium and nitrogen having respective carrier densities reduced, the deterioration of operation characteristics, caused by residual carriers, can be suppressed. Consequently, the active layer is not damaged easily, and an expected operating life can be secured.

In one embodiment of the present invention, the Group V source gas is preferably nitrogen gas. In such an embodiment, hydrogen is less likely to be absorbed into crystals as compared with using ammonium as a nitrogen source. As a result, the quality of crystals can be further improved.

A third method according to the present invention is a method for producing a semiconductor by growing a compound semiconductor, containing at least indium and nitrogen, on a substrate in accordance with an MBE technique. The method includes the steps of: irradiating an indium molecular beam onto the upper surface of the substrate; and irradiating a molecular beam containing nitrogen onto the upper surface of the substrate. The step of irradiating the molecular beam containing nitrogen further includes the step of making nitrogen atoms, contained in the molecular beam containing nitrogen, excited.

In accordance with the third method, nitrogen atoms contained in a Group V source gas are excited in the step of irradiating a molecular beam of the Group V source gas containing nitrogen onto the upper surface of a substrate. Accordingly, the nitrogen atoms having a high vapor pressure are more likely to be introduced into the faces of crystals grown on the substrate. Thus, the same effects as those attained by the second method of the present invention can also be attained.

In the second or third method of the present invention, a radio frequency plasma generation technique or an electron cyclotron resonance plasma generation technique is preferably used in the step of exciting. In such an embodiment, since the nitrogen atoms or molecules are turned into plasma, active nitrogen can be produced with more certainty.

A semiconductor laser device according to the present invention includes: a first cladding layer of a first conductivity type formed on a substrate; an active layer formed on the first cladding layer and made of a compound semiconductor containing at least indium and nitrogen; and a second cladding layer of a second conductivity type formed on the active layer. The density of residual carriers in the active layer is less than $1 \times 10^{17}$ cm$^{-3}$.

In the semiconductor laser device of the present invention, the density of residual carriers in the active layer, made of a compound semiconductor containing at least indium and nitrogen, is less than $1 \times 10^{17}$ cm$^{-3}$. Accordingly, the deterioration of operation characteristics, caused by residual carriers, can be suppressed and the active layer is not damaged easily. As a result, an expected operating life can be secured and the reliability of the device can be improved.

DESCRIPTION OF THE PREFERRED EMBODIMENTS

The present inventors made an analysis from various angles on the reason why a semiconductor laser device emitting light at a short wavelength by using a Group III–V compound semiconductor containing indium and nitrogen, such as InGaN, has a short operating life. As a result, we arrived at the following conclusion.

In general, a compound semiconductor crystal like InGaN is grown by an NOVPE or MBE technique. In Japanese Laid-open Publication No. 6-196757, a method for growing an InGaN layer of excellent crystal quality on a GaN layer by using nitrogen gas as a carrier gas during an MOVPE process is disclosed. However, as described in *Journal of Applied Physics*, Vol. 74, (1993) pp. 3911–3915, an InGaN semiconductor crystal shows n-type conductivity even when not doped with any impurity and the residual carrier density thereof reaches as high as $1 \times 10^{17}$ cm$^{-3}$ or more.

This phenomenon is presumably explained as follows. Since the growth temperature of InGaN semiconductor crystals is lower than that of GaN semiconductor crystals, a large number of nitrogen vacancies would be generated in the InGaN crystals. These vacancies would behave as donors to make n-type conduction, constitute lattice defects and move inside the crystals, thereby damaging an active layer. A semiconductor laser device emitting light at a short wavelength by using InGaN has a short operating life probably because of these reasons.

The InGaN multi-quantum well active layer (see the above-identified *Applied Physics Letters*, Vol. 70 (1997) pp. 1417–1419) has been doped with Si in order to increase the amount of light emitted therefrom. Accordingly, in such a case, lattice defects, caused by nitrogen vacancies, would be more likely to move and the multi-quantum well active layer would be damaged more easily.

Based on this conclusion, according to the present invention, in growing an active layer made of a Group III–V compound semiconductor containing indium and nitrogen for a short-wavelength-oscillating semiconductor laser device, the residual carrier density in the active layer is controlled at less than $1 \times 10^{17}$ cm$^{-3}$, thereby reducing nitrogen vacancies. In this manner, the present invention prevents the active layer from being damaged and procures an expected operating life for a device.

EMBODIMENT 1

Hereinafter, the first embodiment of the present invention will be described with reference to FIG. 1.

Figure 1:
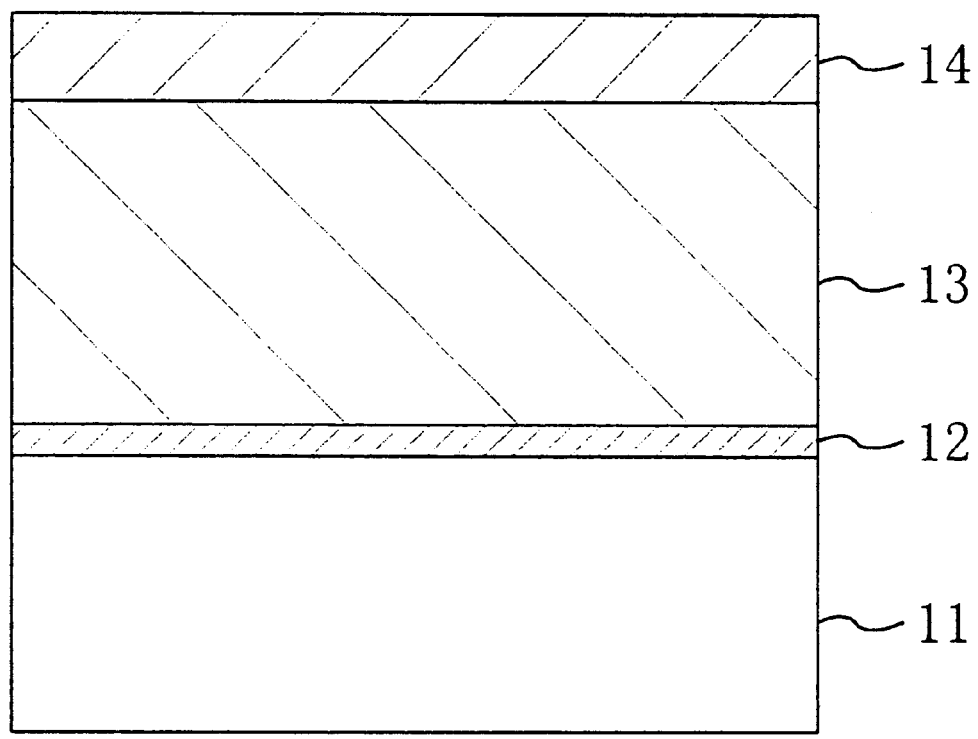
FIG. 1 is a cross-sectional view illustrating the structure of a compound semiconductor containing indium and nitrogen as a product of a method for producing a semiconductor in the first embodiment of the present invention.

FIG. 1 illustrates the cross-sectional structure of a compound semiconductor containing indium and nitrogen produced by the method of the first embodiment. As shown in FIG. 1, a buffer layer 12, made of non-doped GaN, for buffering lattice mismatching between a sapphire substrate 11 and semiconductor crystals containing nitrogen is formed on the substrate 11. On the buffer layer 12, an underlying layer 13, made of non-doped GaN, for growing an InGaN layer of high quality is formed. And on the underlying layer 13, a semiconductor layer 14, made of non-doped InGaN, is formed.

The substrate 11 may also be made of GaN, SiC, Si, Spinel, ZnO, GaAs or the like, instead of sapphire. Also, the substrate 11 may be of n-type, p-type or insulating. The plane orientation of the substrate 11 is not necessarily defined by a low-index plane. Alternatively, the plane orientation of the substrate 11 may be defined by an inclination in a certain direction. For example, if the substrate 11 is made of SiC, the zone axis thereof may be inclined from the (0001) plane of 4H-SiC by two degrees in the [11-20] direction.

The buffer layer 12 may also be made of AlN, AlGaN, SiC or the like, instead of GaN. The thickness of the buffer layer 12 is variable with the combination of materials for the substrate 11 and the semiconductor layer 14, and is ordinarily in the range from about 2 nm to about 500 nm. Also, if the substrate 11 is made of GaN having the same lattice constant as that of the underlying layer 13, then the buffer layer 12 need not be provided.

The underlying layer 13 is provided for growing a semiconductor layer 14 of high quality. This layer 13 is made of GaN, because GaN can be high-quality crystals more easily than any other Group III–V compound semiconductor containing nitrogen. The thickness of the underlying layer 13 may be any value equal to or larger than about 1 $\mu$m, and is preferably set at about 3 $\mu$m. The crystal quality of the underlying layer 13 at such a thickness is represented by its high resistance from an electrical point of view. And the carrier density thereof is immeasurable. In the photoluminescence (PL) spectrum thereof at room temperature, band-edge emission in the vicinity of 362 nm is dominant. The half-width of the rocking curve thereof measured with a double crystal X-ray spectrometer is about 250 arcs.

The thickness of the InGaN semiconductor layer 14 is 100 nm, and the In mole fraction thereof may be arbitrarily set. The larger the In mole fraction is, the higher the residual carrier density is, and the more apparent n-type conductivity is exhibited. Correspondingly, in the PL spectrum thereof at room temperature, the band-edge emission appears at a longer wavelength and the emission intensity weakens. As a result, the half-width of the rocking curve thereof measured with a double crystal X-ray spectrometer broadens.

In order to produce such an InGaN semiconductor crystal, MOVPE, MBE or any other VPE such as hydride VPE is used. In accordance with MOVPE, crystal of higher quality can be obtained at a higher growth rate. On the other hand, in accordance with MBE, the face of a growing crystal can be controlled and observed at the same time on the level of an atomic layer.

In this specification, for example, a Group III source gas containing gallium elements and supplying gallium atoms when dissolved will be called a "gallium source". Similarly, a Group V source gas containing nitrogen elements and supplying nitrogen atoms when dissolved will be called a "nitrogen source".

In accordance with MOVPE, a trialkyl metal compound such as trimethyl gallium (TMG) or triethyl gallium (TEG) is used as a gallium source. A trialkyl metal compound such as trimethyl aluminum (TMA) or triethyl aluminum (TEA) is used as an aluminum source. A trialkyl metal compound such as trimethyl indium (TMI) or triethyl indium (TEI) is used as an indium source.

As a nitrogen source, ammonium ($NH_3$) gas, hydrazine ($N_2H_4$) gas or the like is used. As a source of silicon to be n-type impurity ions, silane ($SiH_4$) or the like is used. As a source of magnesium to be p-type impurity ions, biscyclopentadienyl magnesium ($Cp_2Mg$) gas or the like is used.

On the other hand, in accordance with MBE, metal Ga, metal Al and metal In are used as the gallium, aluminum and indium sources supplying Group III atoms. Si and Mg are used as impurity sources. Nitrogen gas, ammonium gas or the like is excited in the state of plasma in accordance with radio frequency (RF) plasma generation technique or electron cyclotron resonance (ECR) plasma generation technique, and used as a nitrogen source supplying Group V atoms.

Hereinafter, a method for producing a compound semiconductor having the above-described structure in accordance with MOVPE will be described.

First, a sapphire substrate 11, the principal surface of which is a C plane, is cleaned and held on a susceptor inside a reaction chamber. Then, after the reaction chamber has been exhausted, the substrate 11 is heated at 1080° C. for 15 minutes within hydrogen ambient at 70 Torr, thereby cleaning the surface of the substrate 11.

Next, the temperature of the substrate 11 is lowered to 500° C. Hydrogen, TMG and ammonium gases are supplied into the reaction chamber as a carrier gas, a Group III source gas and a Group V source gas, respectively. And Group V and Group III atoms are supplied into the reaction chamber by setting the molar ratio of the Group V atoms supplied to the Group III atoms supplied (hereinafter, simply expressed as "Group V/Group III molar ratio") at 5000. In this manner, a GaN buffer layer 12 is grown to be 40 nm thick on the principal surface of the substrate 11.

Thereafter, the temperature of the substrate 11 is raised to 1000° C. And after the Group V/Group III molar ratio is decreased to 2000, the temperature is further raised stepwise up to 1060° C. At the temperature, crystals are grown for 1.25 hours, thereby forming a GaN underlying layer 13 to be 3 $\mu$m thick on the upper surface of the buffer layer 12.

Subsequently, the supply of TMG is stopped and the temperature of the substrate 11 is lowered to 810° C. Then, the carrier gas is changed from the hydrogen gas into argon (Ar) gas as a rare gas, and TMG and TMI are supplied for one hour by setting the vapor phase ratio of TMI/TMG at 0.9 and the Group V/Group III molar ratio at 10000. In this manner, an InGaN semiconductor layer 14 is grown to be 100 nm thick on the upper surface of the underlying layer 13.

In this embodiment, the carrier gas, as well as a bubbling gas for TMG and TMI, is changed into argon gas. However, since the flow rate of the bubbling gas is very small compared with the total flow rate of all these gases, the bubbling gas may remain hydrogen gas.

In this specification, a carrier gas, vaporizing an organic metal source material stored in a container when supplied into the container, will be called a "bubbling gas".

In the carrier gas, the concentrations of impurities such as water and oxygen are preferably as low as possible. The argon gas used in this embodiment has been highly purified using a gettering purifier. The In mole fraction of the semiconductor layer 14 may be set at an arbitrary value, but is preferably set at about 0.4 or less. In such a case, InGaN crystals of high quality can be obtained.

If the crystal quality of the semiconductor layer 14 grown in this manner is evaluated electrically, the residual carrier density thereof is $7 \times 10^{15}$ $cm^{-3}$ and the resistivity thereof is 900 $\Omega$cm. In the PL spectrum at room temperature, band-edge emission in the vicinity of 426 nm is dominant, and the intensity of emission from a deep level is about 5% of the intensity of the band-edge emission. The half-width of the rocking curve thereof measured with a double crystal X-ray spectrometer is about 350 arcs. The surface morphology thereof observed with an optical microscope is like a mirror surface, and the formation of In droplets is not observed.

For the sake of comparison, the buffer layer 12 and the underlying layer 13 are grown on the substrate 11 on completely the same conditions as those described above. Then, during the growth of the semiconductor layer 14, the same source gases as those described above are supplied while nitrogen gas is supplied as a carrier gas. In such a case, a semiconductor layer with a thickness of 100 nm can be formed in 1.5 hours. If the quality of the InGaN semiconductor crystals is evaluated electrically, the residual carrier density thereof is $3 \times 10^{17}$ $cm^{-3}$, which apparently shows n-type conductivity.

It is not clear why the residual carrier density of InGaN crystals decreases with argon gas used as a carrier gas. This phenomenon happens presumably because thermodynamic factors and chemical kinetics factors interact with one another in the following manner. The growth temperature of InGaN crystals is lower than that of GaN crystals. And if ammonium is used as a nitrogen source, then ammonium is dissolved with lower efficiency. Therefore, it has conventionally been considered that nitrogen vacancies are more likely to be generated in such a case. However, if neither one of hydrogen and nitrogen gases, which are finally produced as a result of the decomposition of ammonium, is used as a carrier gas, then ammonium would be dissolved with higher efficiency and the generation of nitrogen vacancies would be suppressed.

Also, if argon gas is used as a carrier gas, then the partial pressure of hydrogen, which is produced simultaneously with the formation of the InGaN crystal layer, decreases inside the reaction chamber. As a result, the decomposition of the InGaN crystal layer is suppressed. Accordingly, as compared with using nitrogen gas as a carrier gas, the growth rate of the crystals would be accelerated.

Furthermore, the thermal conductivity of a gas is one of the parameters for a reaction rate variable with the type of a gas. Comparing argon gas with nitrogen gas, the thickness of a boundary layer is expected to be substantially equal in both cases in view of the values of density and viscosity coefficient thereof. However, the thermal conductivity of argon gas is lower than that of nitrogen gas. Accordingly, the generation of nitrogen vacancies would be suppressed and the growth rate of InGaN crystals would increase.

It is considered that the quality of the InGaN crystal layer is improved and the density of n-type residual carriers, resulting from nitrogen vacancies, decreases to be less than $1 \times 10^{17}$ cm$^{-3}$ because of the above-described reasons.

In this embodiment, argon gas is used as a carrier gas. Alternatively, any other rare gas such as helium (He) gas, neon (Ne) gas, krypton (Kr) gas or xenon (Xe) gas may also be used. With any of these gases, the residual carrier density in an InGaN crystal layer can be effectively reduced.

InGaN is exemplified as a Group III–V compound semiconductor containing indium and nitrogen. Alternatively, the Group III–V compound semiconductor may be single crystal nitride containing a Group III element such as In, Al, Ga or B and a Group V element such as P or As at an arbitrary ratio in a crystal of InN, InAlGaN, InGaNAs, BInN or InGaNP.

In this embodiment, crystals are grown at a reduced pressure of 70 Torr in accordance with MOVPE. However, the same effects can be attained even if the present invention is applied to a crystal growth at an atmospheric pressure.

As described above, the residual carrier density of a Group III–V semiconductor crystal containing indium and nitrogen can be reduced in this embodiment by using a rare gas as a carrier gas during a production process. Accordingly, in light-emitting diode, semiconductor laser device, photo diode or any other optoelectronic or electronic device formed by using this Group III–V semiconductor crystal, the deterioration in operation characteristics, caused by residual carriers, can be suppressed. Consequently, an expected operating life can be secured and high reliability is attained.

EMBODIMENT 2

Hereinafter, the second embodiment of the present invention will be described.

In this embodiment, a method for producing a Group III–V compound semiconductor containing indium and nitrogen in accordance with an MOVPE technique different from that used in the first embodiment will be described.

First, a sapphire substrate 11, the principal surface of which is a C plane, is cleaned and held on a susceptor inside a reaction chamber. Then, after the reaction chamber has been exhausted, the substrate 11 is heated at 1080° C. for 15 minutes within hydrogen ambient at 70 Torr, thereby cleaning the surface of the substrate 11.

Next, the temperature of the substrate 11 is lowered to 500° C. Hydrogen, TMG and ammonium gases are supplied into the reaction chamber as a carrier gas, a Group III source gas and a Group V source gas, respectively. And the Group V and Group III atoms are supplied into the reaction chamber by setting the Group V/Group III molar ratio at 5000. In this manner, a GaN buffer layer 12 is grown to be 40 nm thick on the principal surface of the substrate 11.

Thereafter, the temperature of the substrate 11 is raised to 1000° C. And after the Group V/Group III molar ratio is decreased to 2000, the temperature is further raised stepwise up to 1060° C. At the temperature, crystals are grown for 1.25 hours, thereby forming a GaN underlying layer 13 to be 3 μm thick on the upper surface of the buffer layer 12.

Subsequently, the supply of the source gases is stopped and the temperature of the substrate 11 is lowered to 850° C. Then, the pressure inside the reaction chamber is reduced to 1 Torr, for example. And the source gas supplying nitrogen atoms is changed from the ammonium (NH$_3$) gas into nitrogen (N$_2$) gas. By making the N$_2$ gas flow through an ECR plasma discharge tube where the frequency is 2.45 GHz and the output power is 500 W, nitrogen atoms in the N$_2$ source gas are excited to form plasma. As a result, the N$_2$ gas is supplied onto the upper surface of the substrate 11 held on the susceptor in the reaction chamber as active N$_2$ gas including nitrogen molecular radicals or nitrogen atomic radicals. And TMG and TMI are supplied for 40 minutes by setting the vapor phase ratio of TMI/TMG at 0.9 and the Group V/Group III molar ratio at 10,000 and by using the N$_2$ gas as a carrier gas. In this manner, an InGaN semiconductor layer 14 is grown to be 100 nm thick on the upper surface of the underlying layer 13.

By controlling the output of the ECR plasma discharge tube, the flow rate of the N$_2$ source gas, or the pressure in the reaction chamber with the plasma state monitored using plasma spectroscopy, the production of nitrogen molecular and atomic radicals in the active nitrogen gas can be controlled. If the density of the nitrogen atomic radicals is set at a relatively high value, then the growth rate of the semiconductor layer 14 increases.

It is noted that radio frequency (RF) plasma may be used for the plasma discharge.

In this embodiment, nitrogen gas is used as a nitrogen source and excited to form plasma. Accordingly, as compared with an ordinary MOVPE process, the source gas as a nitrogen source is even more cracked and activated. As a result, crystals of higher quality can be grown at a temperature lower than usual.

Also, since no hydrogen is contained in any source gas during the growth of the semiconductor layer 14, the semiconductor layer 14 is less likely to be dissolved even at a higher growth temperature. Accordingly, it is possible to raise the upper limit of the temperature range in which the InGaN crystals can be grown.

The quality of the InGaN crystals grown in this manner is evaluated as follows. In the PL spectrum at room temperature, band-edge emission in the vicinity of 435 nm is dominant, and the intensity of emission from a deep level is about 5% of the intensity of the band-edge emission. The half-width of the rocking curve measured for the InGaN crystals using a double crystal X-ray spectrometer is about 420 arcs. The surface morphology thereof observed with an optical microscope is like a mirror surface, and the formation of In droplets is not observed.

By using an active nitrogen gas including nitrogen molecular or atomic radicals as a nitrogen source in this manner, the introduction of nitrogen atoms into the faces of crystals is promoted and the density of nitrogen vacancies can be reduced.

In this embodiment, nitrogen gas is used as a source gas to be a nitrogen source. Alternatively, ammonium gas, hydrazine gas, gaseous azide as a compound including N$_3$ or the like may also be used.

Also, in this embodiment, all the nitrogen gas is supplied in the state of plasma as a nitrogen source. Optionally, part of the nitrogen gas may be supplied in the state of plasma as a nitrogen source, while the other part of the nitrogen gas may be supplied as an ordinary gas flow like the carrier gas and the other source gases. Moreover, a source for supplying nitrogen in the state of plasma and a source for supplying nitrogen as an ordinary gas flow may be provided independent of each other.

As described above, high-quality Group III–V semiconductor crystals, containing indium and nitrogen, can be obtained in this embodiment.

EMBODIMENT 3

Hereinafter, the third embodiment of the present invention will be described.

In this embodiment, a method for producing a Group III–V compound semiconductor containing indium and nitrogen in accordance with an MBE technique, not the MOVPE technique used in the second embodiment, will be described.

First, as shown in FIG. 1, a buffer layer 12 and an underlying layer 13 are grown in this order on a substrate 11 in accordance with the MOVPE technique as in the second embodiment.

Thereafter, the substrate 11 is cooled down to room temperature within hydrogen ambient. And the substrate 11, on which the underlying layer 13 has been formed, is taken out of the reaction chamber and held on a substrate holder provided inside an MBE growth chamber. Then, the pressure inside the MBE growth chamber is reduced to create high vacuum. In the MBE growth chamber, a nitrogen radical cell including an RF plasma discharge tube where the frequency is 13.56 MHz and the output power is 600 W; a first Knudsen (K) cell storing a gallium source; and a second K cell storing an indium source are provided.

Next, the upper surface of the underlying layer 13 on the substrate 11 is irradiated with a nitrogen molecular beam including nitrogen atomic radicals, supplied from the nitrogen radical cell, and the temperature of the substrate 11 is raised to 740° C. And the upper surface of the underlying layer 13 on the substrate 11 is also irradiated with a Ga molecular beam from the first K cell for five minutes, thereby further growing the GaN underlying layer 13 by 50 nm.

Subsequently, the upper surface of the underlying layer 13 on the substrate 11 is further irradiated with an In molecular beam from the second K cell for ten minutes at a flux ratio of 0.35. As a result, an InGaN semiconductor layer 14 is grown to be 100 nm thick on the underlying layer 13 on the substrate 11. If ammonium or the like is used as a source gas to be a nitrogen source, a great many hydrogen atoms are absorbed into crystals. Thus, nitrogen gas not containing hydrogen atoms is preferably used.

By controlling the output of the RF plasma discharge tube, the flow rate of the $N_2$ gas, or the pressure in the growth chamber with the plasma state monitored using plasma spectroscopy, the production of nitrogen molecular and atomic radicals in the active nitrogen gas can be controlled. If the density of nitrogen atomic radicals is set at a relatively large value, then the growth rates of the GaN and InGaN crystal layers increase. For example, the growth rate can be as high as about 1 μm/h in this embodiment. In particular, the growth rate of the InGaN crystal layer can be higher as compared with employing an MOVPE technique.

If the crystal quality of the InGaN crystals grown in this manner is evaluated electrically, the residual carrier density is $3 \times 10^{16}$ cm$^{-3}$ and the resistivity is 25 Ωcm. In the PL spectrum at room temperature, band-edge emission in the vicinity of 409 nm is dominant, and the intensity of emission from a deep level is about 1% of the intensity of the band-edge emission. The half-width of the rocking curve measured for the InGaN crystals using a double crystal X-ray spectrometer is about 380 arcs. The surface morphology thereof observed with an optical microscope is like a mirror surface, and the formation of In droplets is not observed.

As can be understood, even with an MBE technique, if an active nitrogen gas including nitrogen atomic radicals is used as a nitrogen source, the introduction of nitrogen atoms into the faces of crystals is promoted and the absorption of hydrogen atoms into the faces of crystals is suppressed. As a result, the density of nitrogen vacancies can be reduced.

In this embodiment, a nitrogen radical cell including an RF plasma discharge tube is used. Alternatively, a nitrogen radical cell including an ECR plasma discharge tube may also be used.

As described above, high-quality Group III–V semiconductor crystals, containing indium and nitrogen, can be obtained in this embodiment.

EMBODIMENT 4

Hereinafter, the fourth embodiment of the present invention will be described with reference to FIG. 2.

Figure 2:
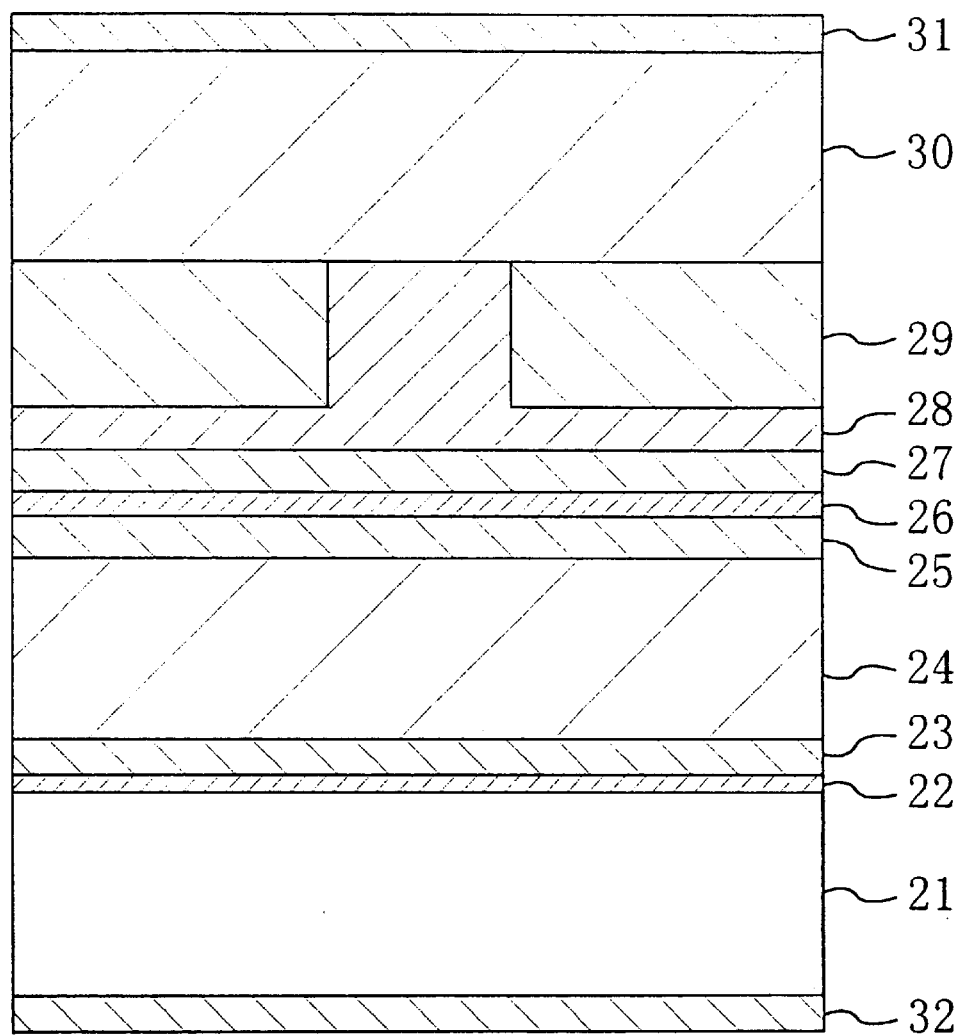
FIG. 2 is a cross-sectional view illustrating the structure of a semiconductor laser device in the fourth embodiment of the present invention.

FIG. 2 illustrates the cross-sectional structure of a semiconductor laser device using the Group III–V compound semiconductor containing indium and nitrogen for the active layer thereof. As shown in FIG. 2, on a substrate 21 made of n-type 6H-SiC, a first buffer layer 22, made of AlN, for buffering lattice mismatching between the substrate 21 and respective crystal layers made of Group III–V compound semiconductors to be grown thereon, is formed. On the first buffer layer 22, a second buffer layer 23, made of AlGaInN, for suppressing the generation of cracking resulting from distortion among the respective crystal layers, is formed. On the second buffer layer 23, a first cladding layer 24, made of n-type AlGaN, for forming a potential barrier for an active layer and confining n-type carriers, is formed. On the first cladding layer 24, a first light guide layer 25, made of GaN, for confining the emitted light, is formed. On the first light guide layer 25, a quantum well active layer 26, made of InGaN, for generating laser light by recombining n-type and p-type carriers with each other, is formed. On the quantum well active layer 26, a second light guide layer 27, made of GaN, for confining the emitted light, is formed. On the second light guide layer 27, a second cladding layer 28, made of p-type AlGaN, for forming a potential barrier for the active layer 26 and confining p-type carriers, is formed. On the second cladding layer 28, a current blocking layer 29, made of n-type GaN, for efficiently injecting current into the active layer 26, is formed. And on the current blocking layer 29, a contact layer 30, made of p-type GaN, for making ohmic contact with an electrode is formed. On the upper surface of the contact layer 30, a p-side electrode 31 is formed of Pd/Au. On the other surface of the substrate 21 opposite to the surface on which the crystal layers are grown, an n-side electrode 32 is formed of Ni/Au.

Hereinafter, a method for fabricating a semiconductor laser device having such a structure will be described. In this embodiment, the respective semiconductor layers are formed on the substrate 21, the principal surface of which is a (0001) carbon plane, in accordance with an MOVPE technique. Alternatively, the principal surface of the substrate 21 may be inclined from the zone axis [11-20] by several degrees. The percentage of lattice mismatching between SiC crystals and GaN crystals is about 3%, while the percentage of lattice mismatching between SiC and AlN is about 1%.

First, the principal surface of the substrate 21 is cleaned and the substrate 21 is held on a susceptor inside a reaction chamber. Then, after the reaction chamber has been exhausted, the substrate 21 is heated at 1080° C. for 15 minutes within hydrogen ambient at 70 Torr, thereby cleaning the surface of the substrate 21.

Next, the temperature of the substrate 21 is lowered to 1000° C. Hydrogen, TMA and ammonium gases are supplied into the reaction chamber as a carrier gas, a Group III source gas and a Group V source gas, respectively. In this manner, the first buffer layer 22, made of AlN, is grown to be 10 nm thick on the principal surface of the substrate 21. Thereafter, the temperature of the substrate 21 is lowered to 910° C. And TMG and TMI gases, as well as the TMA gas, are supplied as Group III source gases, thereby growing the second buffer layer 23, made of AlGaInN, to be 20 nm thick on the upper surface of the first buffer layer 22.

Subsequently, the supply of TMI is stopped and the temperature of the substrate 21 is raised to 1030° C. with silane supplied, thereby growing the first cladding layer 24, made of n-type AlGaN, to be 1 $\mu$m thick and to have an Al mole fraction of 0.1, for example. Then, the supply of TMA and silane is stopped and TMG and ammonium are continuously supplied, thereby growing the first light guide layer 25, made of GaN, to be 90 nm thick.

Next, the supply of TMG is stopped, the temperature of the substrate 21 is lowered to 810° C., the carrier gas is changed from hydrogen gas into argon gas, and TMG and TMI are supplied into the reaction chamber, thereby forming the InGaN quantum well active layer 26. In this embodiment, all the carrier gas, as well as the bubbling gas for TMG and TMI, is changed into argon gas. However, since the flow rate of the bubbling gas is very small compared with the total flow rate of all these gases, the bubbling gas may remain hydrogen gas.

The quantum well active layer 26 is formed by alternately stacking three well layers (each having a thickness of 2.5 nm and an In mole fraction of 0.2) and two well layers (each having a thickness of 5 nm and an In mole fraction of 0.05). On the uppermost well layer, an AlGaN layer is further grown to be 50 nm thick and to have an Al mole fraction of 0.15. The AlGaN layer prevents the InGaN crystals, constituting the quantum wells, from being decomposed and suppresses the overflow of electrons toward the p-type layers, because this flow is reactive current during the operation of the laser device. The quantum well active layer 26 formed in this manner has a residual carrier density as small as less than $1\times10^{17}$ cm$^{-3}$ and low resistivity. As a result, crystals of high quality can be obtained.

Then, the temperature of the substrate 21 is raised to 1030° C., the carrier gas is changed again from argon gas into hydrogen gas, and TMG and ammonium are supplied, thereby growing the second light guide layer 27, made of GaN, to be 90 nm thick on the upper surface of the quantum well active layer 26. Subsequently, TMA and Cp$_2$Mg are supplied as additional source gases, thereby growing the second cladding layer 28, made of p-type AlGaN, to be 600 nm thick. And then the supply of the respective source gases is stopped and the substrate 21 is cooled down to room temperature.

Next, the respective semiconductor layers, which have been epitaxially grown on the substrate 21 in this manner, are subjected to predetermined processes to form a singlemode laser device. The predetermined processes include photolithography, dry etching, re-growth of a buried layer and evaporation to form electrodes.

Specifically, first, a silicon dioxide film is deposited over the entire upper surface of the second cladding layer 28 over the substrate 21. Then, with a 2 $\mu$m-wide striped region masked, the silicon dioxide film is etched until the upper surface of the second cladding layer 28 is exposed, thereby forming a mask pattern out of the silicon dioxide film.

Next, by using this mask pattern, the second cladding layer 28 is etched to the depth of 400 nm, thereby forming a striped convex portion at the center of the second cladding layer 28.

Subsequently, the n-type GaN current blocking layer 29 is selectively grown in accordance with MOVPE so as to fill in the etched portions of the second cladding layer 28. Thereafter, the mask pattern is removed.

Then, the p-type GaN contact layer 30 is grown to be 1 $\mu$m thick on the upper surfaces of the second cladding layer 28 and the current blocking layer 29 over the substrate 21 in accordance with MOVPE again.

A heat treatment for activating Mg acceptors may be either conducted inside the reaction chamber or in a heating oven after the substrate 21 has been once taken out of the reaction chamber. Also, the heat treatment may be conducted in parallel with sintering and evaporation for forming electrodes. The heat treatment is conducted at 600° C. for 20 minutes within nitrogen ambient, for example.

Next, evaporation and sintering are performed to form electrodes. On the p-type layers, the p-side electrode 31 of Pd/Au is formed by alternately evaporating and stacking Pd films (each having a thickness of 10 nm) and Au films (each having a thickness of 300 nm) on the upper surface of the contact layer 30. Under the n-type layers, the n-side electrode 32 of Ni/Au is formed by alternately evaporating and stacking Ni and Au films on the back surface of the substrate 21, after the back surface has been polished.

Then, the substrate 21 processed in this manner is cleaved to form resonant cavities, each having a length of 700 nm, for example. Both end faces of each resonant cavity are coated with an appropriate material. And the resonant cavity is divided into respective laser chips, each of which is mounted on a heat sink in a junction-down fashion.

The operating characteristics of this semiconductor laser device are evaluated as follows: the oscillation wavelength is 415 nm; the threshold current is 45 mA; the external differential quantum efficiency is 70%; and a voltage applied at the start of laser oscillation is 5.3 V.

It is noted that the, epitaxial layers may be formed on the substrate 21 by an MBE technique. Also, the MOVPE and MBE processes may be performed in combination; n-type layers closer to the substrate may be grown by MOVPE and the active layer and the p-type layers may be grown by MBE. The MBE process is advantageous in that p-type conductivity is obtained without conducting heat treatment, because hydrogen passivation does not happen and that InGaN crystals of high quality can be obtained.

What is claimed is:

1. A semiconductor laser device comprising:
   a first cladding layer of a first conductivity type formed on a substrate;
   an active layer, undoped with n-type and p-type impurities, formed on the first cladding layer and made of a compound semiconductor containing at least indium and nitrogen; and
   a second cladding layer of a second conductivity type formed on the active layer,
   wherein a residual carrier density in the active $1\times10^{17}$ cm$^{-3}$.

2. The semiconductor laser device of claim 1, wherein the residual carrier density in the active layer is $3\times10^{16}$ cm$^{-3}$ or less.

* * * * *

UNITED STATES PATENT AND TRADEMARK OFFICE
CERTIFICATE OF CORRECTION

PATENT NO.    : 6,611,005 B2
DATED         : August 26, 2003
INVENTOR(S)   : Ayumu Tsujimura et al.

It is certified that error appears in the above-identified patent and that said Letters Patent is hereby corrected as shown below:

Title page,
Item [56], References Cited, U.S. PATENT DOCUMENTS,
add -- 5,637,146  6/97  Chyi
       5,780,355  7/98  Mishra et al.
       5,970,317  6/97  Okihisa et al. --; and
FOREIGN PATENT DOCUMENTS, add -- 06196757   7/15/94   Japan --; and
OTHER PUBLICATIONS, add -- "$In_n Ga_{(1-x)}N/In_y Ga_{(1-y)}N$ Superlattices Grown on GaN Films, by Nakamura et al., Journal of Applied Physics, Vol. 74, No. 6 (September 15, 1993), pp. 3911-3915, Room-Temperature Continuous-Wave Operation in InGaN Multi-Quantum-Well Structure Laser Diodes with a Lifetime of 27 Hours," Applied Physics Letters, Vol. 70, No. 11 (March 17, 1997), pp. 1417-1419 --

Signed and Sealed this

Sixth Day of July, 2004

JON W. DUDAS
*Acting Director of the United States Patent and Trademark Office*